United States Patent
Ferguson

(10) Patent No.: US 7,043,682 B1
(45) Date of Patent: May 9, 2006

(54) METHOD AND APPARATUS FOR IMPLEMENTING DECODE OPERATIONS IN A DATA PROCESSOR

(75) Inventor: Jonathan Ferguson, London (GB)

(73) Assignee: ARC International, Elstree (GB)

( * ) Notice: Subject to any disclaimer, the term of this patent is extended or adjusted under 35 U.S.C. 154(b) by 445 days.

(21) Appl. No.: 10/358,495

(22) Filed: Feb. 4, 2003

Related U.S. Application Data

(60) Provisional application No. 60/355,448, filed on Feb. 5, 2002.

(51) Int. Cl.
*H03M 13/03* (2006.01)
(52) U.S. Cl. .................................................... 714/796
(58) Field of Classification Search ............... 714/791, 714/786, 795, 796; 375/262, 341
See application file for complete search history.

(56) References Cited

U.S. PATENT DOCUMENTS

| | | | | |
|---|---|---|---|---|
| 5,068,859 | A | 11/1991 | Dolinar et al. | 714/795 |
| 5,151,904 | A | 9/1992 | Reiner et al. | 714/795 |
| 5,432,804 | A | 7/1995 | Diamondstein et al. | 714/795 |
| 5,440,504 | A | 8/1995 | Ishikawa et al. | 708/490 |
| 5,633,897 | A | 5/1997 | Fettweis et al. | 375/341 |
| 5,742,621 | A | 4/1998 | Amon et al. | 714/792 |
| 5,796,756 | A | 8/1998 | Choi et al. | 714/795 |
| 5,802,116 | A | 9/1998 | Baker et al. | 375/341 |
| 5,946,361 | A | 8/1999 | Araki et al. | 375/341 |
| 6,424,685 | B1 | 7/2002 | Messel et al. | 375/341 |
| 6,448,910 | B1 | 9/2002 | Lu | 341/51 |
| 6,690,750 | B1 * | 2/2004 | Hocevar et al. | 375/341 |
| 6,718,504 | B1 | 4/2004 | Coombs et al. | 714/755 |
| 6,757,864 | B1 * | 6/2004 | Hansquine | 714/794 |
| 6,813,744 | B1 * | 11/2004 | Traeber | 714/795 |
| 6,848,074 | B1 | 1/2005 | Coombs | 714/795 |
| 6,862,563 | B1 | 3/2005 | Hakewill et al. | 703/14 |
| 2002/0031195 | A1 | 3/2002 | Honary | 375/341 |
| 2003/0009612 | A1 | 1/2003 | Latta | 710/305 |
| 2003/0225998 | A1 | 12/2003 | Khan et al. | 712/210 |

FOREIGN PATENT DOCUMENTS

| | | |
|---|---|---|
| EP | 1 058 392 A1 * | 5/1999 |
| EP | 1 271 789 A1 | 2/2003 |
| GB | 2 371 953 A | 8/2002 |
| JP | 4369124 | 12/1992 |
| JP | 10075185 | 3/1998 |

OTHER PUBLICATIONS

Verbauwhede et al., A low power DSP engine for wirless communications, 1996, IEEE, p. 471-480.*

* cited by examiner

*Primary Examiner*—Shelly Chase
(74) *Attorney, Agent, or Firm*—Gazdzinski & Associates

(57) ABSTRACT

An improved method and apparatus for performing operations (such as Viterbi decode) in digital processors using a reduced number of cycles. In one aspect, the invention comprises efficient methods for performing multiple "butterfly" add-compare-select (ACS) operations using an improved dual butterfly (DVBF) extension instruction added to the instruction set of a user-configured processor. The DVBF extension allows performance of two butterfly operations in a single cycle. In another aspect, an improved path metric addressing scheme is disclosed. An integrated circuit (IC) device incorporating the aforementioned features, and method of designing such IC, are also disclosed.

24 Claims, 9 Drawing Sheets

FIG. 7

| 31 30 29 28 27 26 25 24 23 22 21 20 19 18 17 16 | 15 14 13 12 11 10 9 8 7 6 5 4 3 2 1 0 |
|---|---|
| Metric B | Metric A |

| 31 30 29 28 27 26 25 24 23 22 21 20 19 18 17 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| | R | R | M1 | LB1 | UB1 | R | R | M0 | LB0 | UB0 |

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| RES | BMS$_1$ | OSL$_1$ | OSH$_1$ | RES | BMS$_0$ | OSL$_0$ | OSH$_0$ |

904 ↗  902 ↗

*(1 of 2)*

(2 of 2)

| Loc | Y(msb) | Y(lsb) | X(msb) | X(lsb) |
|---|---|---|---|---|
| 0 | 3 | 2 | 1 | 0 |
| 1 | 7 | 6 | 5 | 4 |
| ... | ... | ... | ... | ... |
| $2^{(K-4)}-1$ | $2^{(K-2)}-1$ | $2^{(K-2)}-2$ | $2^{(K-2)}-3$ | $2^{(K-2)}-4$ |
| $2^{(K-4)}$ | $2^{(K-2)}+1$ | $2^{(K-2)}$ | $2^{(K-2)}+3$ | $2^{(K-2)}+2$ |
| ... | ... | ... | ... | ... |
| ... | ... | ... | ... | ... |
| $2^{(K-3)}-1$ | $2^{(K-2)}-3$ | $2^{(K-1)}-4$ | $2^{(K-1)}-1$ | $2^{(K-1)}-2$ |
FIG. 11
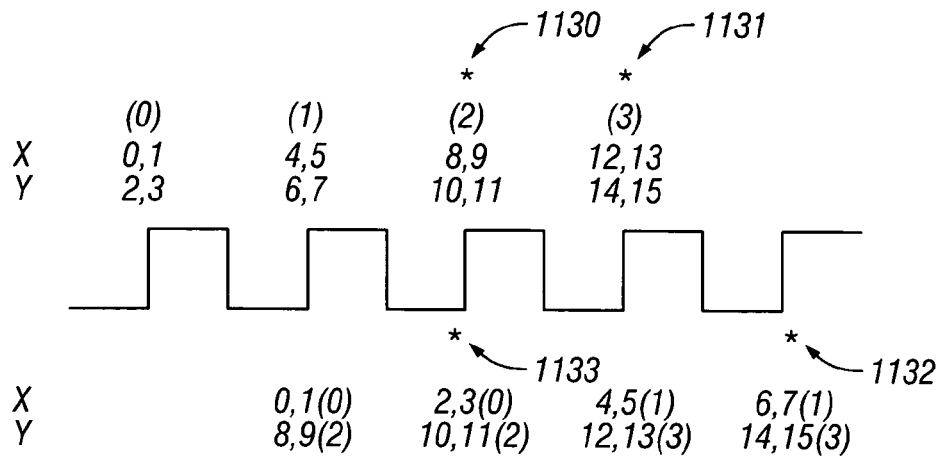
FIG. 11a
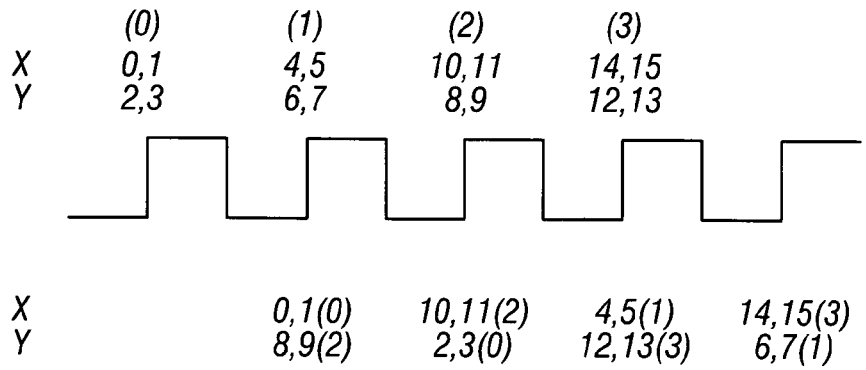
FIG. 11b

METHOD AND APPARATUS FOR IMPLEMENTING DECODE OPERATIONS IN A DATA PROCESSOR

PRIORITY AND RELATED APPLICATIONS

The present application claims priority benefit of U.S. Provisional Application Ser. No. 60/355,448 filed Feb. 5, 2002 and entitled "Method And Apparatus For Implementing Viterbi Decode In A Configurable Data Processor", which is incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of the Invention

The present invention relates generally to the field of data processors, and specifically to an improved data processor and related methods for processing communications data such as, for example, Viterbi decoding.

2. Description of Related Technology

The need for increased efficiency and speed in communications data processing is now ubiquitous. Consumer and other communications applications demand increased performance in a smaller form factor and with less power consumption. This is especially true in consumer wireless handsets, where it is desired to have the most rapid data encoding and decoding possible within the smallest and most power efficient IC, thereby reducing handset size and increasing battery longevity.

Such encoding and decoding processes can be quite complex. The well known Viterbi algorithm is an example of a decoding algorithm used for convolution codes in a memory-less noisy channel. The Viterbi algorithm attempts to estimate the state sequence of the encoder finite state machine (FSM) from the corrupted received data. Since these complex algorithms are run in effect continuously during the communication process, even small gains in efficiency and performance on a per-operation or per-cycle basis can produce large benefits in efficiency and power consumption.

An idealized Viterbi channel encoder/decoder system is shown in FIG. 1. The encoder (FIG. 2) produces a code symbol consisting of two binary bits for every input bit. The code rate ($r=k/n$) is ½, where $k=1$ is the input rate and $n=2$ is the output rate. The number of bits that have an effect upon the output is 3. This parameter is known as the constraint length. The encoder is assumed to be a Mealy type FSM of the kind well known in the art, and so the outputs produced are a function of the current state and the current input.

The encoder's outputs and state transitions can be best visualised with the aid of a state transition diagram, as shown in FIG. 3. The dashed lines 302 represent an input of '0', and vice versa for the solid lines.

An extension of the state diagram is known as a trellis diagram. The trellis displays all the information in a state diagram, and also includes transition in time. The trellis diagram shown in FIG. 4 is for an encoder with code rate=½ and constraint length 3.

The Viterbi encoder will produce a unique set of state transitions for the information bits supplied as shown in FIG. 5. The sequence supplied to this example encoder is $11110_2$ and the state sequence is [S0, S2, S1, S2, S3, S1]. The decoder attempts to determine the FSM's state sequence by finding the path (though the trellis of FIG. 4) that maximise the probability of state sequence the FSM has passed though, given the received data.

As each code symbol is received, it is supplied to all states in a stage (a stage is time slot within the trellis). As can be seen in FIG. 5, each state has two branches leading into it from two separate states. Each state expects a known code symbol to be associated with that branch. Each branch is a terminator for a path though the trellis and each path have an accumulated error metric associated with it.

The code symbols are received by each state (or ACS node). The ACS calculates the branch metric error for each of the branch's expected code symbols and the received code symbols. The branch metric is added to the accumulated error metric for that path and the survivor branch is selected. The survivor is the branch with the lowest total accumulated error. The decisions for each state are stored in the traceback memory. The decision bit stored indicates which branch survived, '0' for upper and '1' for lower.

Traceback can begin after constraint-length×5 code symbols have been processed by the ACS node network. Traceback begins by finding the optimum starting state. The optimum state for hard-decision detection is the state with the smallest total accumulated error. Starting in the optimum state (OP) the next state to be traced-back into is calculated by using the decision bit stored in the OP and from a look-up table of predecessor states for that state. Referring back to FIGS. 2–5, it can be seen that if the OP was state 1 then a decision bit of '0' would lead to state 2. The traceback is continued until the start of the traceback memory. Any code symbols decoded after K*5 can be outputted. The process of the ACS nodes providing decision bits and the traceback memory decoding the output is continued until no more code symbols are available.

A variety of different techniques are known in the prior art for implementing complex algorithms using data processors. These techniques generally fall into one of three categories: (i) "fixed" hardware; (ii) software; and (iii) user-configurable.

So-called 'fixed' architecture processors of the prior art characteristically incorporate special instructions and or hardware to accelerate particular functions. Because the architecture of processors in such cases is largely fixed beforehand, and the details of the end application unknown to the processor designer, the specialized instructions added to accelerate operations are not optimized in terms of performance. Furthermore, hardware implementations such as those present in prior art processors are inflexible, and the logic is typically not used by the device for other "general purpose" computing when not being actively used for coding, thereby making the processor larger in terms of die size, gate count, and power consumption, than it needs to be. Furthermore, no ability to subsequently add extensions to the instruction set architectures (ISAs) of such 'fixed' approaches exists.

Alternatively, software-based implementations have the advantage of flexibility; specifically, it is possible to change the functional operations by simply altering the software program. Decoding in software also has the advantages afforded by the sophisticated compiler and debug tools available to the programmer. Such flexibility and availability of tools, however, comes at the cost of efficiency (e.g., cycle count), since it generally takes many more cycles to implement the software approach than would be needed for a comparable hardware solution.

So-called "user-configurable" extensible data processors, such as for example the ARCtangent™ processor produced by the Assignee hereof, allow the user to customize the processor configuration, so as to optimize one or more attributes of the resulting design. When employing a user-configurable and extensible data processor, the end application is known at the time of design/synthesis, and the user configuring the processor can produce the desired level of functionality and attributes. The user can also configure the processor appropriately so that only the hardware resources required to perform the function are included, resulting in an architecture that is significantly more silicon (and power) efficient than fixed architecture processors. Such configuration can include, for example, the addition of specialized extension instructions (extensions), selection of memory and cache configurations, register sets, ALU configurations, and the like.

The ARCtangent processor is a user-customizable 32-bit RISC core for ASIC, system-on-chip (SoC), and FPGA integration. It is synthesizable, configurable, and extendable, thus allowing developers to modify and extend the architecture to better suit specific applications. It comprises a 32-bit RISC architecture with a four-stage execution pipeline. The instruction set, register file, condition codes, caches, buses, and other architectural features are user-configurable and extendable. It has a 32×32-bit core register file, which can be doubled if required by the application. Additionally, it is possible to use large number of auxiliary registers (up to 2E32). The functional elements of the core of this processor include the arithmetic logic unit (ALU), register file (e.g., 32×32), program counter (PC), instruction fetch (i-fetch) interface logic, as well as various stage latches.

A variety of different approaches to Viterbi decode using digital processors have been put forth in the prior art, the following being exemplary.

United States Patent Application 20020031195A1 to Honary published Mar. 14, 2002 and entitled "Method and apparatus for constellation decoder" discloses a method and apparatus for performing a slicer and Viterbi decoding operations which are optimized for single-instruction/multiple-data (SIMD) type of parallel processor architectures. Some non-regular operations are eliminated and replaced with very regular repeatable tasks that can be efficiently parallelized. A first aspect of the invention provides a pre-slicer scheme where once eight input symbols for a Viterbi decoder are ascertained and their distances calculated, these distances are saved in an array. A second aspect of the invention provides a way of performing the path and branch metric calculations in parallel to minimize processor cycles. A third aspect of the invention provides a method to implement the Viterbi decoder without continually performing a trace back. Instead, the previous states along the maximum likelihood paths for each trellis state are stored. When the path with the shortest distance is later selected, determining the trace back state only requires a memory access.

U.K. Publication No. 2371953 entitled "Viterbi equalizer which compares received data with predicted data based on the channel response estimate to generate path metrics" published Aug. 7, 2002 to Sherratt discloses an equalizer for use in processing received serial data signals sent by a transmitter and which may have been distorted during their transmission. The equalizer includes a trellis generator which receives both the serial data signals and the output of a channel estimator so as to generate the most probable bit sequence sent by the transmitter. The trellis generator operating by allocating to each branch of the trellis entering a particular state an individual branch metric which is based on the space distance between the received signal and the predicted signal received from the predictor for that state so that each branch metric is different from any other branch metric, and operates by calculating the two survivors of each Viterbi butterfly in the trellis at the same time.

Japanese Patent Publication No. 4369124 entitled "Soft Discrimination Viterbi Decode Method" published Dec. 21, 1992 discloses techniques to reduce a bit error rate of an original signal by calculating a margin for taking a bit string and applying soft discrimination Viterbi decoding thereto in the process of phase detection of a received carrier to obtain the bit string in the case of transmission of a convolution code. A soft discrimination Viterbi decoder is provided with a soft discrimination data calculation section to which a memory is built to calculate a soft discrimination data from a phase detected by a demodulation section. A de-interleave memory is connected to an output of the calculation section, and stores the soft discrimination data calculated by the calculation section. A Viterbi algorithm execution section is connected to the memory and a path memory storing an object path in the process of obtaining an optimum path. The data stored in the memory is read by the execution section while the bit sequence rearranged at the transmission is restored. Thus, the execution section uses the read soft discrimination data to obtain an optimum path on a trellis diagram thereby outputting a reproduction signal.

U.S. Pat. No. 5,796,756 to Choi, et al. issued Aug. 18, 1998 and entitled "Survivor memory device in Viterbi decoder using trace deletion method" discloses a memory device in a Viterbi decoder which determines a final survivor path using a trellis diagram and decision vectors, and outputs decoded data corresponding to the determined survivor path. The survivor memory device includes a path existence information generator for receiving a plurality of decision vectors, and for generating first branch path existence information representing whether a branch path exists between each state and the corresponding next states in the trellis diagram. A plurality of units are serially connected with respect to the outputs of the path existence information generator. Each unit comprises a path existence information store for receiving and storing the first branch path existence information, a path removal signal generator for generating corresponding path removal signals when the first branch path existence information corresponding to each current state represents that corresponding branch paths do not exist between each current state and the corresponding next states, and a path existence information updator for receiving the first branch path existence information stored in the path existence information store and the path removal signals generated by the path removal signal generator, and for updating values of second branch path existence information corresponding to each current state to represent that corresponding branch paths do not exist between each current state and the corresponding previous states.

Japanese Patent No. 10075185 entitled "Viterbi Decode Device" and published Mar. 17, 1998 discloses techniques for the Viterbi decoding of multilevel modulated data to which a redundant bit is applied by a convolution code by using a simple Viterbi decoder for binary modulation. Multilevel demodulated data obtained by receiving and demodulating a multilevel modulated signal are inputted and transmitted through circuits for converting the multilevel demodulated data into plural binary soft judgment data, so that data converted into binary data can be decoded by using a QPSK Viterbi decoder which is capable of soft judgment for binary modulation. Thus, the soft judgment of a multi-level modulated signal can be easily attained in digital ground broadcasting or the like, and at the same time, the sharing of a circuit with digital satellite broadcasting can be attained.

U.S. Pat. No. 6,448,910 to Lu issued Sep. 10, 2002 and entitled "Method and apparatus for convolution encoding and Viterbi decoding of data that utilize a configurable processor to configure a plurality of re-configurable processing elements" discloses a method and apparatus for convolution encoding and Viterbi decoding utilizing a flexible, digital signal processing architecture that comprises a core processor and a plurality of re-configurable processing elements arranged in a two-dimensional array. The core processor is operable to configure the re-configurable processing elements to perform data encoding and data decoding functions. A received data input is encoded by configuring one of the re-configurable processing elements to emulate a convolution encoding algorithm and applying the received data input to the convolution encoding algorithm. A received encoded data input is decoded by configuring the plurality of re-configurable processing elements to emulate a Viterbi decoding algorithm wherein the plurality of re-configurable processing elements is configured to accommodate every data state of the convolution encoding algorithm. The core processor initializes the re-configurable processing elements by assigning register values to registers that define parameters such as constraint length and code rate for the convolution encoding algorithm. See also United States Patent Application Publication No. 20020135502 published Sep. 26, 2002.

U.S. Pat. No. 6,424,685 to Messel, et al. issued Jul. 23, 2002 entitled "Polar computation of branch metrics for TCM" discloses a method and apparatus for decoding TCM signals including simplified polar computations and Viterbi decoding. The method includes converting the received signal from Cartesian to polar coordinates in order to provide a reduction in the number and complexity of the associated calculations. The branch metric computation for the Viterbi decoding algorithm is performed using polar samples of the demodulated signal.

U.S. Pat. No. 5,946,361 to Araki, et al. issued Aug. 31, 1999 and entitled "Viterbi decoding method and circuit with accelerated back-tracing and efficient path metric calculation" discloses a Viterbi decoding circuit which stores comparison result bits in a bit-accessible path memory unit. A back-trace is performed by setting a state value in a shift register, then shifting comparison result bits from the path memory unit into the shift register. A certain number of bits at the shift-in end of this register are supplied as read address bits to the path memory unit. The Viterbi decoding circuit has selectors that first select old path metric values and branch metric values, which are added or subtracted to produce candidate path metric values, then select the candidate path metric values, which are subtracted to produce a comparison result bit representing the sign of their difference. These additions and subtractions are performed by the same arithmetic unit.

U.S. Pat. No. 5,802,116 to Baker, et al. issued Sep. 1, 1998 and entitled "Soft decision Viterbi decoding with large constraint lengths" discloses a method and apparatus for obtaining a soft symbol decoded output of a received signal by a two pass Viterbi operation. The technique is applied where the signal is convolutionally encoded with large constraint lengths. During the first pass, the error-correction co-processor (ECCP) is programmed for hard decoded output alone. After all the received symbol sets are hard-bit decoded, a second pass Viterbi operation is performed. Using the previously decoded hard bit to identify the most likely next state at an initial time instant, and initializing the present states at that initial time instant with pre-saved accumulated costs from the first pass Viterbi operation, branch metrics are computed for those state transitions leading to the most likely next state at that time instant. The accumulated cost values of the present states leading to the most likely next state are updated, and the absolute value of their difference is coded as a reliability of the hard decoded output corresponding to that time instant. The combination of the hard decoded output and the reliability obtained from the second pass Viterbi operation results in a soft symbol decoded output. At this point, the symbol set received at this time instant during the first pass Viterbi operation is reloaded into the ECCP which updates the accumulated cost values of all possible next states. These steps are repeated until all desired soft symbols are obtained.

U.S. Pat. No. 5,742,621 to Amon, et al. issued Apr. 21, 1998 and entitled "Method for implementing an add-compare-select butterfly operation in a data processing system and instruction therefor" discloses a parallel data structure and a dedicated Viterbi shift left instruction to minimize the number of clock cycles required for decoding a convolutionally encoded signal in a data processing system in software. Specifically, the data structure and Viterbi shift left instruction ostensibly reduce the number of clock cycles required for performing an add-compare-select butterfly operation. The add-compare-select butterfly operation is included in a DO loop in a plurality of instructions for executing a Viterbi decoding algorithm, and is repeated a predetermined number of times, for choosing the best path through a trellis diagram.

U.S. Pat. No. 5,440,504 to Ishikawa, et al. issued Aug. 8, 1995 and entitled "Arithmetic apparatus for digital signal processor" discloses a digital signal processor arithmetic apparatus capable of performing Viterbi decoding processing at a high speed with minimum addition of hardware and overhead of memory. Pathmetric value and branchmetric value read out from first and second memories on two paths are simultaneously added by an adder at most significant bits and least significant bits thereof. A comparator compares values of the most significant bits and the least significant bits output from the adder to generate a path select signal indicating the value which is path-metrically smaller. The select signal is stored in a shift register on a bit-by-bit basis. Of the values of the most significant bits and the least significant bits of a register storing the output of the adder, the smaller one as decided by the path select signal is written in the memory at eight most significant bits or least significant bits thereof via distributor, a bus and a register.

U.S. Pat. No. 5,432,804 to Diamondstein, et al. issued Jul. 11, 1995 and entitled "Digital processor and Viterbi decoder having shared memory" discloses an integrated circuit with a digital signal processor (DSP) and an error correction co-processor (ECCP) that implements a Viterbi decoding function. The DSP and ECCP share a block of multi-port memory, typically by bus multiplexing a dual-port RAM. When the ECCP possesses the RAM, it inhibits the DSP from accessing that block of the RAM by asserting an EBUSY flag. This technique conserves and optimizes the RAM usage, allowing the DSP and ECCP to be formed on the same integrated circuit chip.

U.S. Pat. No. 5,633,897 to Fettweis, et al. issued May 27, 1997 and entitled "Digital signal processor optimized for decoding a signal encoded in accordance with a Viterbi algorithm" discloses a DSP having two internal data buses with two MAC units each receiving data from its respective data bus. A shifter is interposed between the multiply unit and the ALU and accumulate unit. The improved DSP also has a multiplexer interposed between one of the MAC units and the two data buses. The improved DSP is optimized to decode a received digital signal encoded in accordance with the Viterbi algorithm, wherein the DSP calculates a first pair of binary signals $C_{2n}$ and $C_{2n+1}$, a Viterbi butterfly based upon a second pair of binary $C_n$ and $C_{n+m/2}$, and a transitional signal a, in accordance with: $C_{2n}$=minimum ($C_n$+a, $C_{n+m/2}$−a); $C_{2n+1}$=minimum ($C_n$−a, $C_{n+m/2}$+a).

U.S. Pat. No. 5,068,859 to Dolinar, et al issued Nov. 26, 1991 and entitled "Large constraint length high speed Viterbi decoder based on a modular hierarchial decomposition of the deBruijn graph" discloses a method of formulating and packaging decision-making elements into a long constraint length Viterbi decoder which involves formulating the decision-making processors as individual Viterbi butterfly processors that are interconnected in a deBruijn graph configuration. A fully distributed architecture, which achieves high decoding speeds, is made feasible by wiring and partitioning of the state diagram. This partitioning defines universal modules, which can be used to build any size decoder, such that a large number of wires is contained inside each module, and a small number of wires is needed to connect modules. The total system is modular and hierarchical, and it implements a large proportion of the required wiring internally within modules and may include some external wiring to fully complete the deBruijn graph.

U.S. Pat. No. 5,151,904 to Reiner, et al. issued Sep. 29, 1992 and entitled "Reconfigurable, multi-user Viterbi decoder" discloses a decoding system for decoding a digital data stream that has been convolutionally encoded in accordance with a selected constraint length and selected polynomial codes. The system system includes a processor, such as a Viterbi decoder, that is reconfigurable so that it can decode encoded digital data streams for a number of different user channels for which data streams have been convolutionally encoded in accordance with respectively different combinations of selected constraint length and selected polynomial codes. The decoding system includes a Viterbi decoder for processing the encoded data stream in accordance with said selected constraint length and in accordance with said selected polynomial codes to decode the encoded data stream; a RAM for storing data of said selected constraint length and data of said selected polynomial codes in accordance with which said data stream was encoded; and a RAM I/O interface circuit responsive to a user channel identification signal for retrieving said selected constraint length data and said selected polynomial code data from the RAM and configuring the Viterbi decoder in accordance with said selected constraint length and said selected polynomial codes. In order to accommodate concurrent multiple user channels, the RAM stores different sets of combinations of constraint length data and polynomial code data corresponding to different user channels, with said different sets being retrievable from the RAM in response to respectively different user channel identification signals. The polynomial code data and constraint length data in the RAM may be changed from time to time in response to software instructions, as user channel requirements change. The Viterbi decoder processes said encoded data stream over a plurality of decoding cycles and produces intermediate decoding results during different decoding cycles; and the RAM I/O interface circuit stores in the RAM said intermediate decoding results produced for each different user channel during the different decoding cycles.

Despite the foregoing variety of solutions, none are able to perform at least one complete butterfly (two ACS) operations in a single cycle. Furthermore, none of the foregoing solutions permit the designer of the processor to readily add such a high-performance Viterbi decode extension instruction to the ISA during the design phase, the resulting design being optimized according to one or more criteria such as power conservation, clock speed, and die size due to reduced memory overhead and limited hardware requirements to support the extension.

SUMMARY OF THE INVENTION

The present invention satisfies the aforementioned needs by providing improved methods and apparatus for processing communications operations including the exemplary Viterbi decode algorithm(s).

In a first aspect of the invention, a method of performing Viterbi decoding operations comprising a plurality of butterfly operations is disclosed. In one embodiment, the method comprises: reading path metrics for first and second states from a first region of a storage device for a first of the butterfly operations; reading path metrics for third and fourth states from a second region of the storage device for a second of the butterfly operations; determining new path metrics for the third and fourth states based at least in part on the path metrics read from the storage device; and writing the new path metrics for the first butterfly operation to the second region.

In a second aspect of the invention, a method for determining a path metric associated with a butterfly operation of a digital signal processor is disclosed. In one embodiment, the method comprises: providing at least one existing path metric and at least one control word by retrieving the at least one path metric from a first location in XY memory; determining a first branch metric and a second branch metric based on the control word, if required, determining the negatives of at least one of the first and second branch metrics; selecting one branch metric from the group comprising the first and second branch metrics and the at least one negative if determined; determining at least one new path metric based at least in part on the selected branch metric and the at least one existing path metric; and storing the at least one new path metric at a second location within the XY memory, the second location being different from the first location.

In a third aspect of the invention, a control data word for use in Viterbi decode operations of a digital signal processor is disclosed. In one embodiment, the word comprises: at least first, second and third data fields, the first field contiguous within the word with the second field, the second field contiguous with the third field wherein the first, second, and third fields each comprising a plurality of data bits and relating to a first butterfly operation, and at least fourth, fifth and sixth data fields, the fourth field contiguous within the word with the fifth field, the fifth field contiguous with the sixth field wherein the fourth, fifth, and sixth fields each comprising a plurality of data bits and relating to a second butterfly operation; the first and second butterfly operations each comprising two add-compare-select (ACS) operations; the plurality of data bits for the first, second, fourth, and fifth fields comprising first and second data bits, the first and second bits being mapped to combinations of path and branch metrics. The mapping of the first and second bits for the first and fourth fields comprises: (i) 00–path metric 0+branch metric 0 (ii) 01–path metric 0+branch metric 1, (iii) 10–path metric 0–branch metric 1 and (iv) 11–path metric 0–branch metric 0.

In a fourth aspect of the invention, a method of processing Viterbi state information within a processor having a memory is disclosed. In one embodiment, the method comprises: providing a plurality of path metrics for each of a plurality of states; concatenating at least two of the path metrics for adjacent states to produce a word; and storing the word at a location in memory the path metrics comprising 16-bits in length, and the word comprising 32-bits.

In another embodiment, the method comprises: providing a plurality of path metrics for each of a plurality of states: concatenating at least two of the path metrics for adjacent states to produce a word; and storing the word at a location in memory, the storing comprising: (i) providing an addressing mode adapted to store data so that it can be read linearly during a subsequent decoding cycle; and (ii) storing the path metrics according to the addressing mode; and wherein the path metrics are stored according to the addressing mode in the order comprising $0, 2^{K-2}, 1, 2^{K-2}+1, 2, \ldots, 2^{K-2}-2, 2^{K-1}-2, 2^{K-2}-1, 2^{K-1}-1$.

In a fifth aspect of the invention, a dual butterfly extension instruction, usable within the ISA of a user-configured digital processor, is disclosed. In one embodiment, the extension instruction performs, when executed on the processor, at least two Viterbi butterfly decode operations, each of the decode operations comprising determining new path metrics using a plurality of add-compare-select (ACS) operations, obtaining existing path metrics from a first storage location associated with the processor, and storing the new path metrics at a second storage location different from the first.

In a sixth aspect of the invention, a digital processor having an instruction set with at least one Viterbi decode instruction is disclosed. In one embodiment, the processor comprises: a multistage pipeline; a storage device configured to store a plurality of metric data; and add-compare-select (ACS) hardware operatively coupled to the pipeline and the storage device. The at least one instruction (i) performs multiple ACS operations associated with the Viterbi decode in a single instruction cycle using the ACS hardware; and (ii) stores metrics generated by the performance of the ACS operations within the storage device; and the processor is user-configurable at design, the user-configurability including the ability to add at least one extension instruction to the instruction set, the at least one extension instruction comprising the at least one Viterbi decode instruction.

In another embodiment the processor comprises: a multistage pipeline; a storage device configured to store a plurality of metric data; and add-compare-select (ACS) hardware operatively coupled to the pipeline and the storage device. The at least one instruction is adapted to (i) perform multiple ACS operations associated with the Viterbi decode in a single instruction cycle using the ACS hardware; and (ii) store metrics generated by the performance of the ACS operations within the storage device; and the ACS operations utilize a control word having a plurality of fields for selecting a sum and difference metric, and branch metrics.

In a seventh aspect of the invention, a method of providing an optimized communications operations processor is disclosed. In one embodiment, the method comprises: providing a basecase processor core configuration having a base instructions set, the basecase core configuration being at least partly configurable by a user; and configuring the basecase core to form an extended core, the extended core comprising at least one communications operation extension instruction and associated hardware, and a storage device for storing data associated with the communications operations. The extended core runs a computer program including the at least one extension instruction, the extended core being optimized for performing the communications operations, and the communications operations comprise Viterbi butterfly operations, and the act of configuring comprises configuring the at least one extension instruction to perform a plurality of ACS operations associated with the Viterbi Butterfly operations in a single instruction cycle.

BRIEF DESCRIPTION OF THE DRAWINGS

FIG. 7 is an exemplary register encoding (Aux_D-VBF_BM0/1) according to the present invention.

FIG. 8 is an exemplary DVBF control word—operand 1 according to the present invention.

FIG. 9 is a graphical representation of exemplary control data bit mapping in the processor of the present invention.

FIG. 11 is an exemplary tabular representation of path metric storage in XY Memory according to the invention.

FIG. 11a is a graphical representation of exemplary read/write operations for a 16 state decoder.

FIG. 11b is a graphical representation of exemplary read/write operations, showing correct locations for a 16 state decoder.

DETAILED DESCRIPTION

Figure 1:
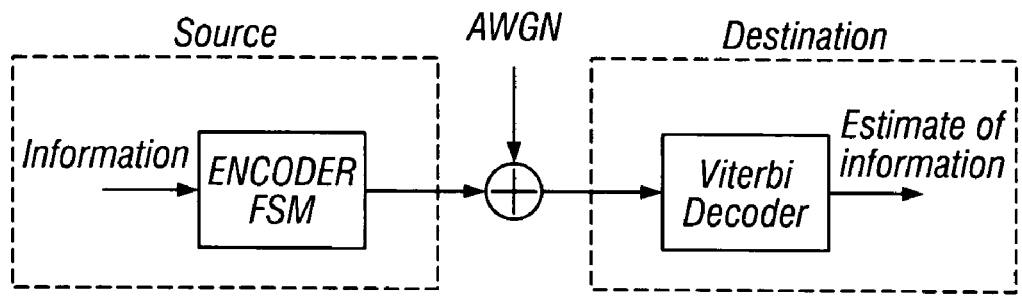
FIG. 1 is a block diagram of a prior art digital communication system.
Figure 2:
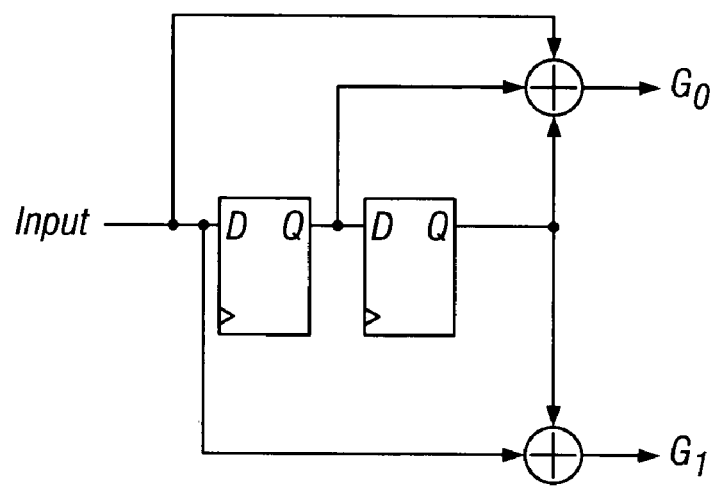
FIG. 2 is a block diagram of an exemplary prior art convolutional encoder.
Figure 3:
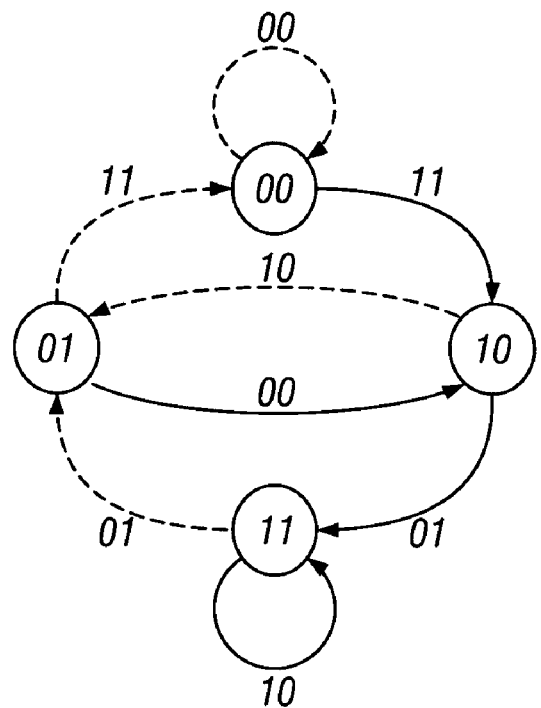
FIG. 3 is an exemplary state diagram for the encoder of FIG. 2.
Figure 4:
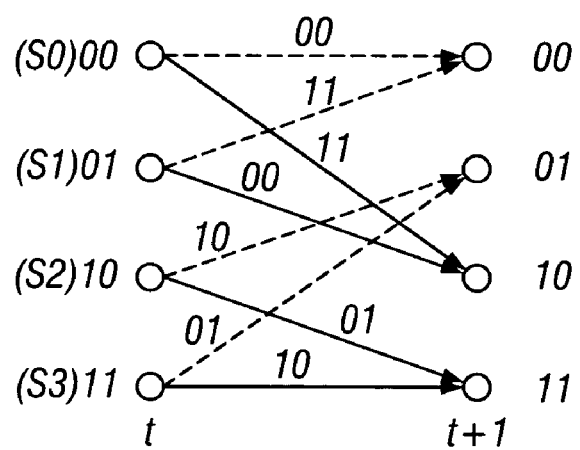
FIG. 4 is an exemplary trellis diagram.
Figure 5:
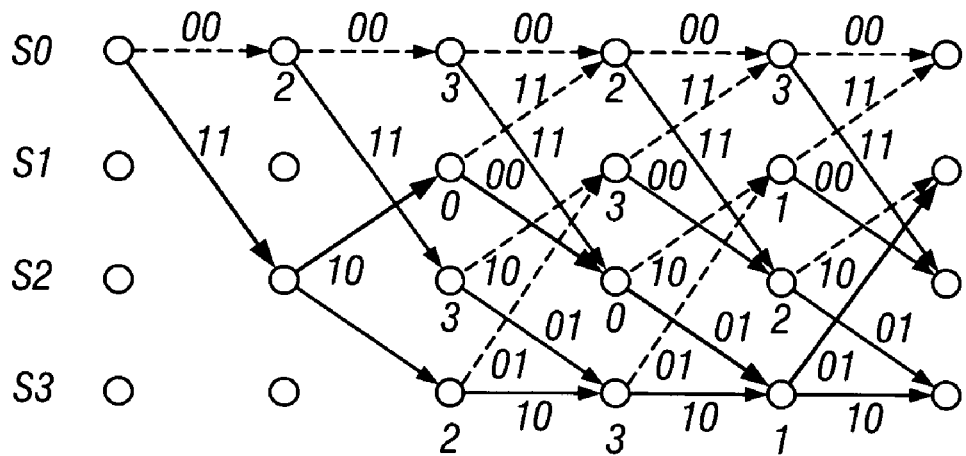
FIG. 5 is a trellis diagram for an exemplary encoding finite state machine (FSM).

Reference is now made to the drawings wherein like numerals refer to like parts throughout.

As used herein, the term "processor" is meant to include any integrated circuit or other electronic device (or collection of devices) capable of performing an operation on at least one instruction word including, without limitation, reduced instruction set core (RISC) processors, such as for example the ARCtangent™ A4 user-configurable core (described in Appendix I hereto) and the ARCompact™ A5 manufactured by the Assignee hereof, central processing units (CPUs), and digital signal processors (DSPs). The hardware of such devices may be integrated onto a single substrate (e.g., silicon "die"), or distributed among two or more substrates. Furthermore, various functional aspects of the processor may be implemented solely as software or firmware associated with the processor.

Additionally, it will be recognized by those of ordinary skill in the art that the term "stage" as used herein refers to various successive stages within a pipelined processor; i.e., stage 1 refers to the first pipelined stage, stage 2 to the second pipelined stage, and so forth. Such stages may comprise, for example, instruction fetch, decode, execution, and writeback stages.

Furthermore, the term "storage device" is used to refer to a device adapted to store one or more pieces of data. While the following description is cast primarily in terms of an XY memory of the type well known in the art, it will be recognized that other types of memory and storage devices may be used consistent with the invention. Specifically, any type of storage device having address space that can be functionally partitioned or divided into two or more "component" spaces, whether physically integrated or otherwise, may be substituted.

As used herein, the terms "arithmetic" and "arithmetic unit" refer to operations and devices for performing arithmetic operations including, without limitation, addition, subtraction, multiplication, accumulation, comparison of two or more values, division, shifting of one or more bits, and the like.

As used herein, the term "ACS" refers to one or more add-compare-select operations. The term "butterfly" refers generally to a plurality (e.g., 2) linked ACS operations.

The term "symbol" refers to the output of an encoder for a single data bit.

Lastly, any references to hardware description language (HDL) or VHSIC HDL (VHDL) contained herein are also meant to include other hardware description languages such as Verilog®. Furthermore, an exemplary Synopsys® synthesis engine such as the Design Compiler 2000.05 (DC00) may be used to synthesize the various embodiments set forth herein, or alternatively other synthesis engines such as Buildgates® available from, inter alia, Cadence Design Systems, Inc., may be used. IEEE std. 1076.3-1997, IEEE Standard VHDL Synthesis Packages, describes an industry-accepted language for specifying a Hardware Definition Language-based design and the synthesis capabilities that may be expected to be available to one of ordinary skill in the art.

It will be appreciated that while portions of the the following discussion are cast in terms of an exemplary ARCtangent processor manufactured by the Assignee hereof, the present invention may be equally applied to other types of digital processors and architectures as referenced above.

Furthermore, it will be recognized that while the following discussion is cast in terms of the well known Viterbi decode algorithm, the methodologies and apparatus disclosed herein may be readily applied with proper adaptation to other types of processes and algorithms which are generally recursive in nature, such adaptation being well within the skill of the ordinary artisan give the present disclosure.

Overview

The exemplary ARCtangent processor is a user-customizable 32-bit RISC core for ASIC, system-on-chip (SoC), and FPGA integration. It is synthesizable, configurable, and extendable, thus allowing developers to modify and extend the architecture to better suit specific applications. The processor comprises a 32-bit RISC architecture with a four-stage execution pipeline. The instruction set, register file, condition codes, caches, buses, and other architectural features are user-configurable and extensible. It has a 32×32-bit core register file, which can be doubled if required by the application. Additionally, it is possible to use large number of auxiliary registers (up to 2E32). The functional elements of the core of this processor include the arithmetic logic unit (ALU), register file (e.g., 32×32), program counter (PC), instruction fetch (i-fetch) interface logic, as well as various stage latches.

ARCompact™ is an innovative instruction set architecture (ISA) that allows designers to mix 16 and 32-bit instructions on its 32-bit user-configurable processor. The key benefit of the ISA is the ability to cut memory requirements on a SoC (system-on-chip) by significant percentages, resulting in lower power consumption and lower cost devices in deeply embedded applications such as wireless communications and high volume consumer electronics products.

The main features of the ISA include 32-bit instructions aimed at providing better code density, a set of 16-bit instructions for the most commonly used operations, and freeform mixing of 16- and 32-bit instructions without a mode switch—significant because it reduces the complexity of compiler usage compared to mode-switching architectures. The instruction set expands the number of custom extension instructions that users can add to the base-case processor instruction set. Existing processor architectures allows users to add a limited number of new instructions to speed up critical routines and algorithms. With the ARCompact ISA, users can add as many as 256 new instructions. Users can also add new core registers, auxiliary registers, and condition codes.

As 32-bit architectures become more widely used in deeply embedded systems, code density can have a direct impact on system cost. Typically, a very high percentage of the silicon area of a system-on-chip (SoC) is taken up by memory.

The ARCompact ISA delivers high density code helping to significantly reduce the memory required for the embedded application, a vital factor for high-volume consumer applications, such as flash memory cards. In addition, by fitting code into a smaller memory area, the processor potentially has to make fewer memory accesses. This can cut power consumption and extend battery life for portable devices such as MP3 players, digital cameras and wireless handsets. Additionally, the shorter instructions can improve system throughput by executing in a single clock cycle some operations previously requiring two or more instructions. This can boost application performance without having to run the processor at higher clock frequencies.

The support for freeform use of 16 and 32-bit instructions allows compilers and programmers to use the most suitable instructions for a given task, without any need for specific code partitioning or system mode management. Direct replacement of 32-bit instructions with 16-bit instructions provides an immediate code density benefit, which can be realized at an individual instruction level throughout the application. As the compiler is not required to restructure the code, greater scope for optimizations is provided, over a larger range of instructions. Application debugging is more intuitive because the newly generated code follows the structure of the original source code.

The present invention provides, inter alia, a dual butterfly instruction useful for communications applications such as the aforementioned Viterbi decode algorithms. The exemplary Dual Viterbi Butterfly (DVBF) instruction is a hardware accelerating instruction for performing Viterbi decoding, which can be added to the "basecase" core by the user at time of processor design. As its name suggests, it performs, in a single cycle, two "butterfly" operations, each consisting of two add-compare-select (ACS) operations, and generates/stores the decision bits defining which branches gave the largest accumulated path metrics. The instruction allows an end-user to speed up the ACS recursion by a factor of approximately 20 over prior art solutions.

The majority of the computational load in a Viterbi decoding operation is made up of many such butterfly operations, so that performing them in hardware, two per cycle, results in a very substantial improvement in speed. The details of how the instruction works, and is used in the context of an exemplary digital processor, are set out in the following paragraphs. Appendix I provides an exemplary decoder program (K=9, rate ½). Appendix II provides a second exemplary decoder program (K=5, rate ½). Appendix III provides exemplary VHDL implementing the DVBF extension of the present invention.

Metrics

Viterbi decoding proceeds by attempting to find the most likely sequence of encoder states given the signals actually received. For a rate ½ encoder, each input bit causes a state transition in the encoder which generates 2 code bits (or a 2 bit symbol). These code bits are converted into physical signals, such as voltage levels, and sent via a communication channel to a receiver. At the receiver these physical signals have been degraded by attenuation, noise and other distortions. The decoding algorithm requires "branch metrics" that are a measure of how likely it is that a given encoder transition gave rise to the received signals. (a "branch" is synonymous with an encoder transition). For a given encoder transition it is known what symbol would be generated and therefore what physical signals would be transmitted, so the difference between these transmitted signals and the signals actually received can be used. The greater the difference, the less likely is the encoder transition in question.

Suppose a symbol consisting of signals levels Y1 and Y2 is received. For a given encoder transition, the symbol generated will cause transmission of signal levels R1 and R2. A common measure of the difference between [R1|R2] and [Y1|Y2] is the "squared Euclidean distance", as follows:

$$\text{metric value}=(R1-Y1)^2+(R2-Y2)^2 \quad \text{(Eqn. 1)}$$

This is the basic form of the metric used with the exemplary embodiment of the DVBF instruction, although some optimizations are made as follows. First, the above expression is expanded:

$$\text{metric}=R1^2+Y1^2-2R1Y1+R2^2+Y2^2-2R2Y2 \quad \text{(Eqn. 2)}$$

For a given received symbol (Y1|Y2), the values $Y1^2$ and $Y2^2$ are common to all branch metrics. Since only the relative value of the different branch metrics is of interest (in order to select the most likely path), these common terms can be removed, and the modified metric used as follows $$\text{metric}=R1^2-2R1Y1+R2^2-2R2Y2 \quad \text{(Eqn. 3)}$$

R1 and R2 are the transmitted voltages for the symbol. It is assumed that the baseband encoding scheme is antipodal, meaning that a binary '1' in the symbol is encoded as a voltage of −v, while a binary '0' is encoded as +v. In this case:

$$R1^2=R2^2=v^2 \quad \text{(Eqn. 4)}$$

and hence are common to all branch metrics, so that these terms can also be removed, giving:

$$\text{metric}=-2R1Y1-2R2Y2 \quad \text{(Eqn. 5)}$$

Note that so far, the metric is a measure of the difference between the transmitted and received symbols, and therefore the minimum value of this metric is desired. It is desired to locate the transition that gives rise to a transmitted symbol that differs least from the symbol actually received.

The final step is to divide by −2 v. This affects all possible metrics equally and so preserves their ordering, except for a reversal, so that the maximum value is now desired. This gives the following:

$$\text{metric}=r1Y1+r2Y2 \quad \text{(Eqn. 6)}$$

where, r1 and r2 correspond to R1 and R2, but are scaled to +/−1. Table 1 below shows how branch metrics can be calculated for a rate ½ encoder. The encoder symbol column shows the binary symbol generated by the encoder (before being converted into voltage levels for transmission).

TABLE 1

| Encoder Symbol | Metric | Or |
| --- | --- | --- |
| 0 0 | Y1 + Y2 | Sum |
| 0 1 | Y1 − Y2 | Diff |
| 1 0 | −(Y1 − Y2) | −Diff |
| 1 1 | −(Y1 + Y2) | −Sum |

For a rate ½ encoder, the foregoing shows that all the possible branch metrics can be derived from just two quantities, the sum and difference of the voltage levels for the received symbol. This is one of the main simplifications used by the DVBF instruction of the present invention. It will be recognized that the DVBF instruction can also be used for other code rates (such as, for example, rate ⅓ and ⅔ by using 4 branch metric values), such implementations being readily accomplished by those of ordinary skill given the present disclosure.

A further simplification results from the assumption that the encoder polynomials all have a '1' in the most significant bit (so that the input data bit is involved in the exclusive—or calculation for all symbol bits). This means that the encoder symbol produced when the input bit is a '1', is the logical (or bitwise) inverse of that for a '0'. This in turn means that the metric for the branch corresponding to a '1' input bit is −ve of that for the branch corresponding to a '0' input bit. This information is also used in the DVBF hardware of the exemplary embodiment described herein. The parameter passed to the DVBF instruction defines which metric to use for the branch from 2 s to s, and the hardware automatically uses the −ve of this for the branch from 2 s to s+N/2.

Dual Butterfly Instruction

Figure 6:
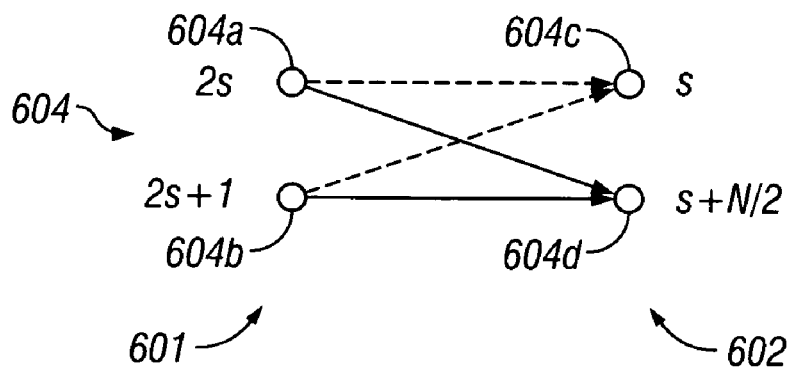
FIG. 6 is graphical representation of an exemplary Viterbi "butterfly" of the type used in Viterbi decode operations.

The Viterbi algorithm (VA) can be split into two distinct sections: (i) the add-compare-select (ACS) recursion; and (ii) traceback. The ACS recursion is formed of many ACS butterfly operations. As can be seen in FIG. 6, each butterfly is a collection of two ACS operations. In the context of a typical prior art processor, to complete a single ACS operation takes several cycles; five or more in the exemplary prior art ARCtangent A4 processor described above. For each codeword decoded, $2^{K-1}$ ACS operations are required. For constraint length K=9, 256 ACS operations are completed in 1280 cycles per codeword. This results in a large number of cycles being spent on the ACS recursion, as a data frame can be several thousand codewords in length. The Dual Butterfly Instruction (DVBF) of the present invention dramatically reduces the cycle count to, in one exemplary embodiment, 72 cycles per codeword for K=9 decoders. The DVBF is advantageously able to process two butterflies (or 4 ACS) per cycle, resulting in a cycle count reduced by a factor of approximately twenty (20).

DVBF Operation

The DVBF instruction of the illustrated embodiment uses cumulative path metrics stored in XY memory, and the metric values placed in auxiliary registers; e.g., AUX_DVBF_BM0/1 (described in greater detail below) to calculate the possible new path metrics for 4 encoder states. It selects the largest path metric for each state and stores this back to XY memory (in an alternative area). For each of the 4 path metrics selected, the instruction shifts a decision bit into the most-significant bit (msb) of auxiliary register AUX_DVBF_ACCU.

The encoder states involved in these calculations are defined in the illustrated embodiment by an internal counter within the DVBF hardware. This counter is initialized via the auxiliary register AUX_DVBF_INTSTAT, and subsequently increments each time the instruction is called, rolling over to 0 when all encoder states have been processed. This rollover is controlled by a value written into the auxiliary register AUX_DVBF_MODE.

The Dual Viterbi Butterfly instruction of the present invention has a large amount of internal state, meaning that its operation is defined by more factors than just the operands passed to it. Several registers require configuration before the instruction is used, and the path metric data area must be initialized.

The DVBF instruction disclosed herein is designed primarily for use in Viterbi decoding algorithms that make several assumptions about the encoder and transmission scheme. As previously discussed, these assumptions are: (i) the polynomials that define the encoder all have a '1' in the most significant bit; and (ii) the transmission/reception of bits forming the encoded symbols is antipodal. When a '0' bit is transmitted, a positive value, +v, will be received (in the absence of any signal distortion or noise), and when a '1' bit is transmitted, a negative value, −v, will be received. The values actually received are altered by noise and other distortions in the transmission channel.

The DVBF instruction performs two "butterflies", each consisting of 2 ACS operations. FIG. 6 illustrates the encoder states 604 involved in one such butterfly and the possible transitions between them. The encoder states on the left portion 601 of FIG. 6 are at time=t, those on the right portion 602 at time=t+1. The arrows of FIG. 6 are the possible state transitions. The simple relationship between the state numbers are due to the fact that the encoder "state machine" is in fact just a shift register. Dashed arrows are transitions that occur when the input to the encoder is a '0', while solid arrows are those when the input is a '1'. When the DVBF instruction is executed, it retrieves the path metrics for states 2s 604a and 2s+1 604b from (XY) memory. Then, using the branch metrics in auxiliary registers AUX_DVBF_BM0/1 and information supplied in operand 1, the instruction calculates the possible new path metrics for states s 604c and s+N/2 604d. This is achieved by adding the appropriate branch metrics to the path metrics.

There are two possible new path metrics for each of state s 604c and s+N/2 604d, corresponding to the two possible transitions into each of these states. The hardware associated with the instruction (not shown) selects the larger path metric value, and stores this back into XY memory. If the selected path metric is that associated with the branch from state 2s 604a ("upper" branch), a '0' decision bit is shifted into the msb of the AUX_DVBF_ACCU register. If the selected path metric is that associated with the branch from state 2s+1 604b ("lower" branch), a '1' decision bit is shifted in. Note that these decision bits are associated with states s and s+N/2, at time t+1, and not with states 2s and 2s+1 at time t. However, because the decision bits are stored sequentially (by shifting into AUX_DVBF_ACCU), the decision bit for state s will be in bit position 2s (relative to the first decision bit) and that for state s+N/2 will be at bit position 2s+1. This information is needed for the traceback part of the decode algorithm.

In the above discussion, the value of s is determined by an internal counter, which is initialized by writing 0 to auxiliary register AUX_DVBF_INTSTAT, and which increments each time a DVBF instruction is executed.

Branch Metrics

AUX_DVBF_BM0/1 702, 704 (FIG. 7) are 32 bit registers and can be used to store four (4) 16-bit metric values. The metrics in BM0 are referred to as "sum" metrics, and those in BM1 as "diff" metrics. The terms "sum" and "diff" derive from the analysis of rate ½ codes but should be considered merely convenient labels for the embodiments described herein, and not determinative of any particular configuration. The use of these metric values is controlled by the contents of operand 1 802 (FIG. 8).

Operand 1 802 is a control word that can be split into two 8-bit fields 804, 806, each with 4 sub-fields, as illustrated in FIG. 8. The least significant 8 bits 804 control butterfly 0, while the top 8 bits 806 have identical meanings for butterfly 1. Each butterfly uses one of the 'sum' metrics and one of the 'diff' metrics previously described, depending on M0/M1 (bits 4–5 and 12–13, respectively) in the exemplary control word of FIG. 8. Literally any combination is possible. Table 2 illustrates an exemplary use of M0/M1.

TABLE 2

| M0/M1 Value | Sum Metric | Diff Metric |
|---|---|---|
| 00 | AUX_DVBF_BM0 (15:0) | AUX_DVBF_BM1 (15:0) |
| 01 | AUX_DVBF_BM0 (15:0) | AUX_DVBF_BM1 (31:16) |
| 10 | AUX_DVBF_BM0 (31:16) | AUX_DVBF_BM1 (15:0) |
| 11 | AUX_DVBF_BM0 (31:16) | AUX_DVBF_BM1 (31:16) |

Referring now to FIG. 9, one exemplary control data bit mapping scheme is illustrated. For Butterfly 0 902 (subscript '0'):

$OSH_0$:

'00' Path metric0+Branch metric 0
'01' Path metric0+Branch metric 1
'10' Path metric0−Branch metric 1
'11' Path metric0−Branch metric 0

$OSL_0$:

'00' Path metric1+Branch metric 0
'01' Path metric1+Branch metric 1
'10' Path metric1−Branch metric 1
'11' Path metric1−Branch metric 0

BMS$_0$:

'00' Branch metric 0=AUX_DVBF_BM0[15:00]|Branch metric1=AUX_DVBF_BM1[15:00]
'01' Branch metric0=AUX_DVBF BM0[15:00]|Branch metric1=AUX_DVBF_BM1[31:16]
'10' Branch metric0=AUX_DVBF_BM0[31:16]|Branch metric1=AUX_DVBF_BM1[15:00]
'11' Branch metric0=AUX_DVBF_BM0[31:16]|Branch metric1=AUX_DVBF_BM1[31:16]

RES: [Reserved]

For Butterfly 1 904, the bit mapping scheme of the present embodiment is the same as that of Butterfly 0 902 shown above. Note that in the illustrated embodiment, bits 31 to 16 are ignored, although it will be recognized that additional functionality may be provided via such bits, such as for example a ⅓ rate decoder.

For each branch in the butterfly, the hardware uses either the sum or diff metric selected, or the negative of one of these, and adds it to the current path metric to find the new path metric. For branches from state 2s, UB0/UB1 selects one of these 4 possible metrics for the branch to state s. This automatically defines which metric will be used for the branch to state s+N/2. This is based on the assumption that the encoder polynomials all have a '1' in the most significant bit, so that the symbol transmitted for a '1' data bit (branch from 2s to s+N/2) is the logical inverse of that transmitted for a '0' data bit (branch from 2s to s). Thus, the metrics for the two branches are of the same magnitude but opposite sign. A similar situation is true for the branches from 2s+1 to s and s+N/2, the metrics for these being selected by LB0/LB1. Exemplary actual metrics used are set out in the Table 3 below.

TABLE 3

| UB0/LB0 | Branch Metric for transition to state s | Branch Metric for transition to state s+N/2 |
|---|---|---|
| 00 | +sum metric | −sum metric |
| 01 | +diff metric | −diff metric |
| 10 | −diff metric | +diff metric |
| 11 | −sum metric | +sum metric |

The illustrated exemplary branch metric scheme is based on certain assumptions about the convolution encoder and the baseband coding scheme, as previously described herein.

Figure 10:
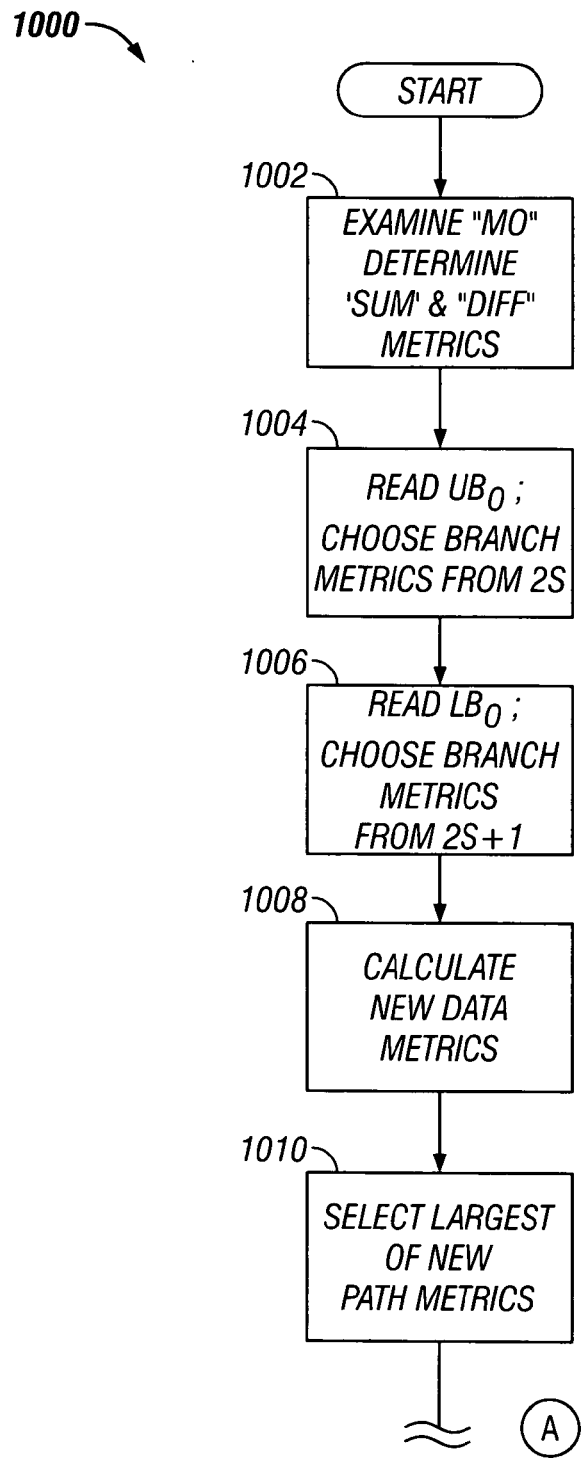
FIG. 10 is a logical flow diagram illustrating an exemplary embodiment of the dual ACS (butterfly) methodology of the invention.
Figure 10:
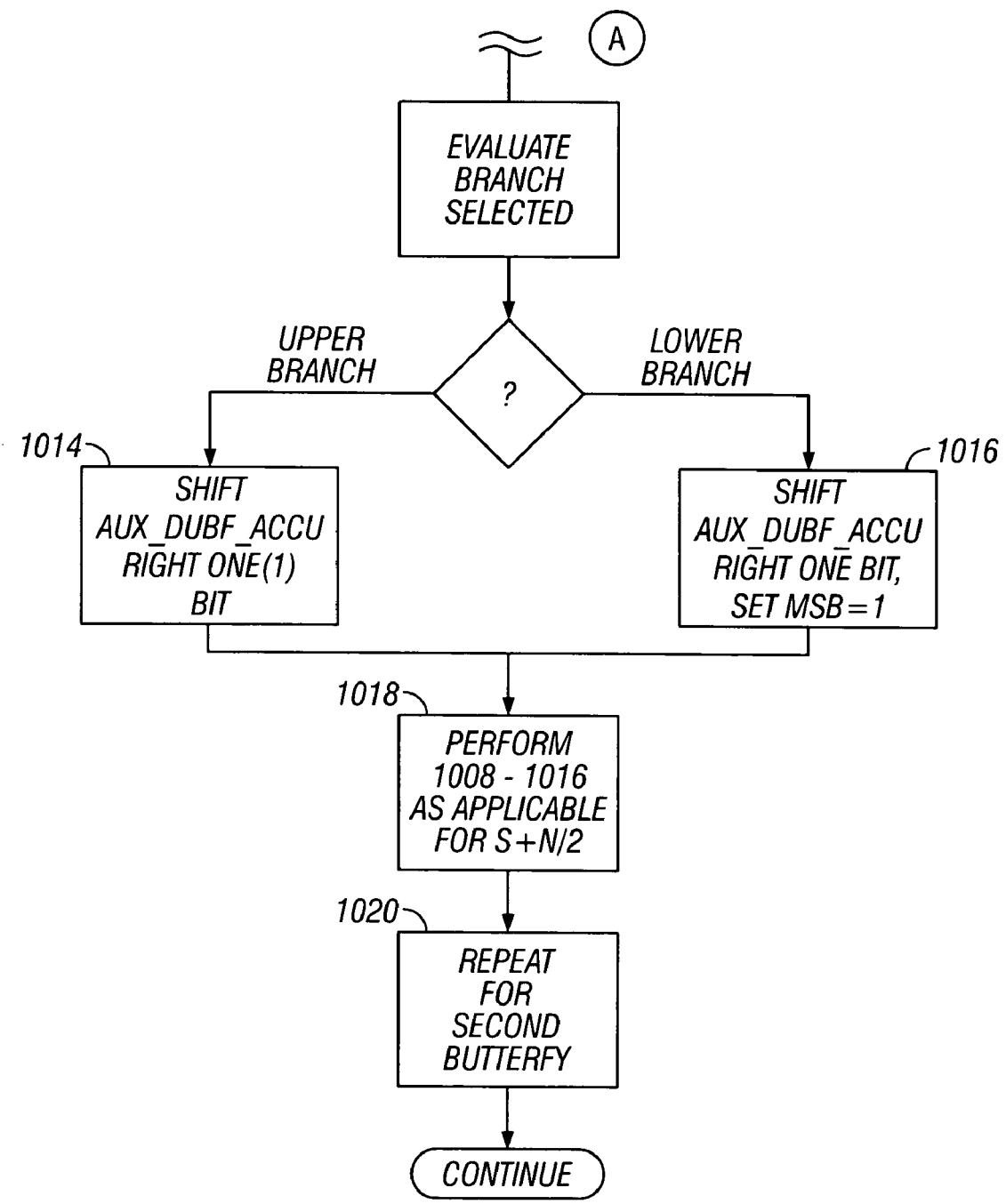

Referring now to FIG. 10, one exemplary embodiment of the decode method of the present invention is described, in the context of calculating the new path metrics for butterfly 0.

As shown in FIG. 10, the method 1000 first examines the M0 field (bits 4–5 of FIG. 8 control word), and uses a mechanism embodying Table 2 to select a "sum" branch metric and a "diff" branch metric (step 1002). It will be recognized that any number of well known mechanisms for providing the logical function of Table 2 may be used, including without limitation a look up table in a designated area of memory. Next, per step 1004, for transitions from state 2s, field UB0 (bits 0–1 of FIG. 8 control word) is examined in conjunction with Table 3 to choose branch metrics to the subsequent states. Next (or in parallel), for transitions from state 2s+1, field LB0 is examined with Table 3 to choose branch metrics to the subsequent states (step 1006).

For state s (at time t+1), the two possible new path metrics are: i) path metric for state 2s+branch metric selected according to UB0; and ii) path metric for state 2s+1+branch metric selected according to LB0. Per step 1008, the hardware of the exemplary processor calculates both of these path metrics. Per step 1010, the hardware selects the largest of the metrics calculated in step 1008. This largest path metric is written back to XY memory in the alternate storage area to that from which path metrics are being read (step 1012).

If the branch from state 2s was selected (upper branch), AUX_DVBF_ACCU is shifted right one bit (step 1014), effectively shifting a 0 into the msb. If the branch from 2s+1 was selected (lower branch), the shift is done and the msb is set to 1 (step 1016).

Per step 1018, steps 1008–1016 as appropriate are repeated for state s+N/2 (at time t+1).

Lastly, per step 1020, the same procedure is carried out for the second butterfly, but instead using M1, UB1 and LB1 (FIG. 8). Obviously, these calculations can be performed in parallel, or serial if desired; however, the present invention advantageously performs two butterflies (each dual ACS) in one cycle.

Path Metric Storage

Path metric data is in the illustrated embodiment stored in XY memory. This allows the DVBF hardware to directly access this data using for example a direct memory interface (DMI) facility at high speed. Note that the term "DMI" as used herein refers generally to an interface which provides access to a RAM or comparable storage device. It does not imply a certain protocol or structure. One exemplary memory interface is described in co-owned and co-pending U.S. patent application Ser. No. 09/801,241 entitled "Memory Interface and Method of Interfacing Between Functional Entities" filed Mar. 7, 2001, which is incorporated herein by reference in its entirety. Other configurations of interface may also be used, such other interfaces being readily implemented herewith by those of ordinary skill.

Figure 12:
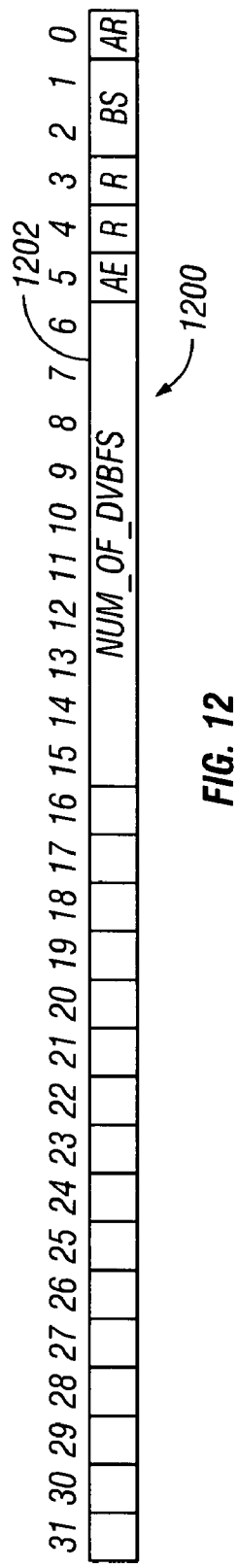
FIG. 12 is an exemplary register encoding (Aux_DVBF_Mode) according to the invention.
Figure 13:
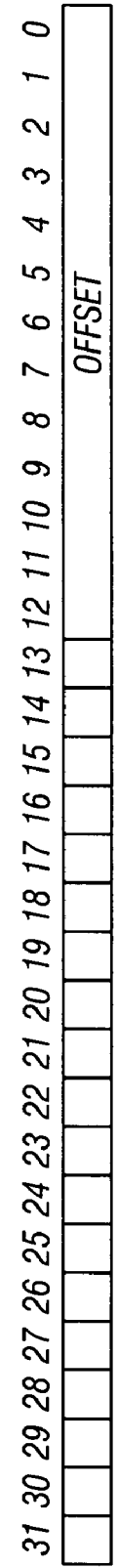
FIG. 13 is an exemplary register encoding (Aux_DVBF_OFST) according to the invention.

The memory bank used is, in the illustrated embodiment, specified by bits 2:1 of the AUX_DVBF_MODE register 1200 (FIG. 12). Each XY memory location (32-bits) is used to store two 16-bit path metrics, and both X and Y memory are used. This requires, therefore, $2^{(K-1)}/4$ locations in each of X and Y memory, where K is the constraint length (so that $2^{(K-1)}/4$ is the number of states in the encoder). However, two identical areas of this size are required. During the decode of a single codeword, involving $2^{(K-1)}/4$ dual butterfly instructions, path metric data is read from one of these XY memory areas, and the updated metric data are written to the other area. This "alternate storage" advantageously allows new path metrics to be calculated out of order and stored without overwriting the current values, the latter which are still required.

One exemplary mapping of path metrics to XY locations is shown in FIG. 11, and is chosen to optimise (simplify) the hardware, although mapping based on one or more other criteria can be applied. FIG. 11 shows a single path metric storage area. In the present embodiment, a second identical area (not shown) is placed immediately above in the same bank of XY memory. The values shown in FIG. 11 are the encoder state number whose path metric is stored at that location.

The path metric data must be initialized by the programmer prior to the start of decoding. This initialization is illustrated in the example code provided herein as Appendix I and II. The first location in X memory is set in the illustrated example to 0XC0000000, while all the others are set to 0XC000C000. This sets all path metrics to a large negative value, except that for state 0. This approach is used because the state machine will always start in state 0, so this is very much more likely than any other state (initially).

In this embodiment, the path metrics for each state are 16-bits in length and are stored as 32-bit words when concatenated with their adjacent state. In each cycle (except the first and last) two 32-bit words (4 path metrics) are read from and written to memory. Due to the nature of the Viterbi algorithm (VA), the reading of the state data is linear, and the writing back of the state data needs a special addressing mode to write data to the correct address so it can be read linearly on the next decoding cycle (i.e. the next codeword). The states are written back in the following order: 0, $2^{K-2}$, 1, $2^{K-2}+1$, 2, . . . , $2^{K-2}-2$, $2^{K-1}-2$, $2^{K-2}-1$, $2^{K-1}-1$. The reads and writes to memory for a 16 state decoder can be seen in FIG. 11$a$. On the first cycle, the path metrics for states 0 and 1 are read from the X region by butterfly 0, and the path metrics for states 2 and 3 are read from the Y region by butterfly 1. On the second write, the data butterfly 0 has the new path metrics for states 2 and 3, however states 2 and 3 are in the Y region and butterfly 0 always writes to the X region. To allow the two butterflies to read and write to different regions some multiplexing or comparable mechanism is needed. The reads and writes marked with an asterisk (*) 1130–1133 are required to be written to the opposite region. The correct locations of the state's path metrics are shown in FIG. 11$b$. On the second cycle, butterfly 0 writes its data to region Y, and vice versa for butterfly 1. The complete map of state location is summarised in Table 4 below, recognizing that the actual locations of particular states will change depending on the total number of states. However, there exists an exception to that rule; states 0 and 1 will always be in location zero (0) of the X region (and in fact, states 2 and 3 will also always be in location 0 of the Y region).

TABLE 4

| Y | | X | |
|---|---|---|---|
| 31 16 | 15 0 | 31 16 | 15 0 |
| 3 | 2 | 1 | 0 |
| . . . | . . . | . . . | . . . |
| $2^{K-2}-4$ | $2^{K-2}-3$ | $2^{K-2}-2$ | $2^{K-2}-1$ |
| $2^{K-2}+3$ | $2^{K-2}+2$ | $2^{K-2}+1$ | $2^{K-2}$ |
| . . . | . . . | . . . | . . . |
| . . . | . . . | . . . | . . . |
| $2^{K-1}$ | $2^{K-1}-1$ | $2^{K-1}-2$ | $2^{K-1}-3$ |

Renormalization

The path metrics are cumulative, so there exists the possibility of overflow. To overcome this, the DVBF hardware of the present embodiment uses a modulo arithmetic scheme when comparing path metrics to decide which is larger. This ensures that the instruction can be used successfully with large data sequences.

In one embodiment, the renormalization process comprises requiring the path metric storage be initialized to $-\infty/2$; for 16-bit data words this value is 0xC000 (or $-16384_d$), state zero is set to zero. The first address location in the X region is set to 0xC000000 and all other locations are set to 0xC000C000, is also noted that address location 0 in Y is also set to this value. The total number of address locations that need to be initialized is as set forth in Eqn. 7:

Number of address locations=(number of states/4)−1    (Eqn. 7)

For example, for a 32-state decoder, address locations 0 to 7 need to be initialised (32/4=8−1=7).

Figure 14:
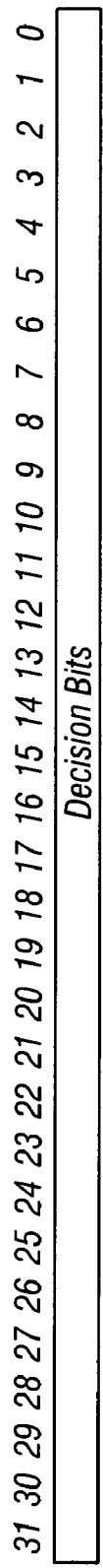
FIG. 14 is an exemplary register encoding (Aux_DVBF_ACCU) according to the invention.
Figure 15:
FIG. 15 is an exemplary register encoding (Aux_DVBF_BM0/1) according to the invention.
Figure 16:
FIG. 16 is an exemplary register encoding (Aux_DVBF_INTSTAT) according to the invention.

The discussion so far has assumed a rate ½ encoder. Other encoder rates can also be accommodated by the present invention, due to the provision of 4 metric values in AUX_DVBF_BM0/1 (FIG. 14). If the analysis previously provided for rate ½ coders is applied to, for example, rate ⅓ encoders, the following table of metrics (Table 5) is generated:

TABLE 5

| Encoder Symbol | Metric | Or |
|---|---|---|
| 0 0 0 | Y1 + Y2 + Y3 | m1 |
| 0 0 1 | Y1 + Y2 − Y3 | m2 |
| 0 1 0 | Y1 − Y2 + Y3 | m3 |
| 0 1 1 | Y1 − Y2 − Y3 | m4 |
| 1 0 0 | −Y1 + Y2 + Y3 | −m4 |
| 1 0 1 | −Y1 + Y2 − Y3 | −m3 |
| 1 1 0 | −Y1 − Y2 + Y3 | −m2 |
| 1 1 1 | −Y1 − Y2 − Y3 | −m1 |

In the same way as for the rate ½ encoder, the metrics for a symbol and for its bitwise complement in the rate ⅓ encoder are the negative of each other. Thus, the DVBF instruction architecture of the present invention may be applied to rate ⅓ decoding. The 4 metrics m1 through m4 can be accommodated by AUX_DVBF_BM0/1, and the control words passed to the DVBF instruction chosen appropriately depending on the encoder polynomials. As will be recognized by those of ordinary skill, so-called "punctured" codes based on a rate ½ encoder can also be accommodated (e.g., ⅔ or ¾) by suitable use of AUX_DVBF_BM0/1.

In addition, the hardware implementation has reserved bits in the control word passed to the instruction (operand 1) so that extra branch metric registers can easily be added to allow more complicated rates to be supported.

Referring now to FIGS. 12–16 and Tables 6–7, details on an exemplary configuration and coding of registers used in conjunction with the present invention are provided.

TABLE 6

| Register Name | Register Number | Access Mode | Width |
|---|---|---|---|
| AUX_DVBF_MODE | 0x26 | R/W | RAMA_SZ + 6 |
| AUX_DVBF_BM0 | 0x27 | R/W | 32 |
| AUX_DVBF_BM1 | 0x28 | R/W | 32 |
| AUX_DVBF_ACCU | 0x29 | R/W | 32 |
| AUX_DVBF_OFST | 0x2A | R/W | RAMA_SZ |
| AUX_DVBF_INTSTAT | 0x2B | R/W | RAMA_SZ + 1 |

AUX_DVBF_MODE—This register 1200 controls several aspects of the Dual Viterbi Butterfly extension instruction, as set out in the exemplary encoding of FIG. 12 and Table 7.

TABLE 7

AUX_DVBF_MODE

| Field | Description |
|---|---|
| AR | Access Request: Request direct control (DMI) over XY memory bank. Setting this bit causes the hardware to request control of the XY memory bank. |
| BS | Bank Select: Select the XY bank to use for path metrics. |
| R | Reserved |
| AE | Access Enabled. The hardware sets this bit to one when DMI is granted for the requested XY memory bank. |

The NUM_OF_DVBFS field 1202 represents the number of DVBF instructions required to calculate all the new path metrics=$2^{(K-1)/4}$.

Note also that the XY memory bank selected for use by the Dual Viterbi Butterfly extension instruction (bits 1–2 of FIG. 12) must be different from the currently selected bank in XYCONFIG [1:0] bank select.

AUX_DVBF_OFST—This register 1300 (FIG. 13) is used to offset path metric storage from the start of the XY memory bank. The width of this register depends on the size of the XY memory banks, and is therefore configurable. It is write only in the illustrated embodiment.

AUX_DVBF_ACCU—This register 1400 (FIG. 14) provides full read/write access to the accumulator used to store decision bits. It is used for initialization and context saving.

AUX_DVBF_BM0/1—These two registers 1500 are used to supply branch metric data to the butterfly instruction. Each received codeword is used to calculate a set of branch metrics for various possible transmitted codewords. These metrics are written to the AUX_DVBF_BM0/1 registers and used in all of the butterfly operations for this received codeword. See FIG. 15 for an exemplary encoding. Each is split into two 16-bit branch metrics, which are written prior to calling the instruction. Which two of the metrics are used for a given butterfly is defined by the control word passed to the instruction, as previously described herein.

AUX_DVBF_INTSTAT—This register 1600 contains all the information regarding the internal state of the instruction hardware, such as which path metrics to operate on next, and which areas of XY memory to read/write path metric from/ to. This register to should be written to 0 before beginning the decode algorithm. Subsequently, it should not be altered. In the case of a context switch, this register is saved and restored if there is any possibility that the new thread will use the DVBF instruction. See FIG. 16 for an exemplary encoding.

The DVBF_Count field represents the number of times the DVBF instruction has been called. This counter wraps round to 0 when its value reaches NUM_OF_DVBFS 1202 (in the AuxDVBF_MODE register 1200). Note also that the width of this field depends on the size of the XY memory. This also means that the location of the next field, PS, is not fixed.

The PS field is the path metric set, and specifies which area of the XY memory to read path metrics from, and which to write to. This toggles each time the DVBF_Count wraps round.

The present invention assumes the use of memory (e.g., XY memory) of the type which is commonly used in processors for storing data that needs to be processed efficiently by a software algorithm, and the use of address generation units to perform the address arithmetic. In the exemplary processor embodiment, a four-stage pipeline (i.e., fetch, decode, execute, and writeback stages) is utilized: in stage 1, instructions are fetched from the instruction cache; in stage 2, one or more operands are fetched from XY memory or the core registers; in stage 3, the instruction is performed in either the base ALU or in one or more user-selectable and configurable extension ALUs. In stage 4 of the pipeline, the results of the instruction execution are written back to XY memory or the core registers as applicable. Hence, the DVBF extension instruction described above is added to the ISA during processor design. The following hardware considerations relate to the addition of the DVBF extension to the core.

The DVBF is a pipeline structure that runs parallel to the processor core pipeline. Decoding of the stage 2 instruction (p2i and s2a) allows the hardware to access XY memory and retrieve the correct path metric data ready for use in stage 3. In stage 3 the control data contained in the s1val signal is passed to the extension, where it is used to control which section of the two branch metric registers to use, and how the data is to be added (or subtracted) to the current path metric. The results of the addition (or subtraction) are latched to allow a high clock frequency to be used. The latched results are used by two comparison modules in the pipeline to determine the new path metric and the decision bits. The modified comparison function is used for modulo renormalization (previously described). The new path metrics are muxed, and written back to the correct region of XY memory. The decision bits are accumulated whether or not the write back is enabled. The results from the accumulator must be written back at least every several instructions.

With a latch present in the pipeline (such as that in the exemplary ARCtangent A4 described above), the core may need to be stalled when the DVBF instruction writes back its data. Therefore, for example, 8 instructions will actually take 9 cycles. This latch can be removed, but the clock frequency may be reduced as compared to with the latch in place.

The extension hardware necessary to support the DVBF extension instruction includes a 32-bit accumulator register for the decision bit data to be stored. The decision bits are accumulated and shifted into the register from the MSB to LSB. This will cause the decision bits from lower states to be disposed in the lower part of the word. For decoders with states of less than 32, the decision bits for states zero can be found at bit position 32 (number of states). The accumulator will be mapped into auxiliary space allowing full read/write access. The auxiliary register named AUX_DVBF_ACCU 1400 (FIG. 14) is allocated register number XX. The processor pipeline will stall if this register is accessed using the auxiliary interface while the ACS extension is busy.

To find the position of a decision bit for a particular state, a simple algorithm can be used:

$$\text{Bit Position}=(\text{state\_number}<<1) \text{ OR } [\{\text{state\_number}>>(K-2)\} \text{ and } 0\times01] \quad \text{(Eqn. 8)}$$

For decoders with state number in excess of 32, more than one word is required to store all the decision bits. To locate the word in which the bit for a the state under inspection, another simple algorithm can be used:

$$\text{Word Number}=\text{state\_number}>>5 \quad \text{(Eqn. 9)}$$

To enable the highest throughput of data, it is optimal to take the control of the path metric storage away from the programmer and to perform this function in hardware. The XY memory DMI enables extension hardware to gain access to the high-speed local XY memory. Writing a one (1) to AUX_DVBF_MODE(0) causes the hardware to request an access to the bank represented by AUX_DVBF_MODE (Bank select, 2 down to 1). Once access is confirmed, the hardware will drive AUX_DVBF_MODE(5) high; no instruction should be issued until this bit is high, as results cannot be guaranteed. Writing a zero (0) to AUX_DVBF_ MODE(0) will cause the hardware to release access to the XY memory bank. AUX_DVBF_MODE(5) will be driven low to indicate that the hardware no longer has access to the bank.

If an interrupt request (IRQ) is serviced while the extension hardware has locked an XY bank using the DMI, there are three techniques available to ensure that the XY memory can be accessed. The first is to not use XY memory in IRQ service routines. The second requires all service routines to not use the bank that is in use. The third is that all service routines write to the AUX_DVBF_MODE register (see previous discussion relating thereto) in order to release the ACS' DMI lock on a bank before using the bank, and then relock the bank for the ACS at the end of the service routine.

Integrated Circuit (IC) Device

As previously described, an extensible and user-configurable processor core is used as the basis for the IC device of the exemplary embodiments described herein; however, other arrangements and configurations may be substituted if desired. The device is fabricated using the customized VHDL design obtained using the method referenced subsequently herein, which is then synthesized into a logic level representation, and then reduced to a physical device using compilation, layout and fabrication techniques well known in the semiconductor arts. For example, the present invention is compatible with 0.35, 0.18, and 0.1 micron processes, and ultimately may be applied to processes of even smaller or other resolution (such as the IBM/AMD 0.065 micron process). An exemplary process for fabrication of the device is the 0.1 micron "Blue Logic" Cu-11 process offered by International Business Machines Corporation, although others may be used.

It will be appreciated by one skilled in the art that the IC device of the present invention may also contain any commonly available peripheral such as serial communications devices, parallel ports, timers, counters, high current drivers, analog to digital (A/D) converters, digital to analog converters (D/A), RF system components, USB ports, interrupt processors, LCD drivers, memories and other similar devices. Further, the processor may also include other custom or application specific circuitry, such as to form a system on a chip (SoC) device useful for providing a number of different functionalities in a single package as previously referenced herein. The present invention is not limited to the type, number or complexity of peripherals and other circuitry that may be combined using the method and apparatus. Rather, any limitations are primarily imposed by the physical capacity of the extant semiconductor processes which improve over time. Therefore it is anticipated that the complexity and degree of integration possible employing the present invention will further increase as semiconductor processes improve.

It will be further recognized that any number of methodologies for designing an IC including synthesizing logic incorporating the "dual butterfly" functionality previously discussed may be utilized in fabricating the IC device. One exemplary method of synthesizing integrated circuit logic having a user-customized (i.e., "soft") instruction set is disclosed in co-owned and co-pending U.S. patent application Ser. No. 09/418,663, now U.S. Pat. No. 6,862,563 issued Mar. 1, 2005 and entitled "Method and apparatus for managing the configuration and functionality of a semiconductor design". Here, the user is presented with a development (and debug) environment which facilitates user customization of the resulting device, including the number and types of extension instructions (and associated hardware), cache and memory configurations, memory interfaces, register files, and the like. The user may also advantageously select the mixed 32-bit/16-bit ISA with instruction aligner as described in co-owned and co-pending U.S. patent application Ser. No. 10/356,129 filed Jan. 31, 2003, entitled "Configurable Data Processor With Multi-Length Instruction Set Architecture", which is incorporated herein by reference in its entirety. As another alternative, the methods and apparatus disclosed in co-owned and co-pending U.S. provisional patent application Ser. No. 60/375,997 filed Apr. 25, 2002, entitled "Apparatus and Method for Managing Integrated Circuit Designs" and incorporated herein by reference in its entirety may be utilized consistent with the present invention. Other methodologies and development environments, whether "soft" or otherwise, may be used consistent with the present invention, however.

Numerous modifications and adaptations of the above described embodiments and aspects of the invention will be readily apparent to a person skilled in the art of designing digital processors (such as digital signal processors and embedded RISC processors) in view of the disclosure provided herein. It will also be recognized that while certain aspects of the invention have been described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

I claim:

1. A method of performing Viterbi decoding operations comprising a plurality of butterfly operations, comprising:
    reading path metrics for first and second states from a first region of a storage device for a first of said butterfly operations;
    reading path metrics for third and fourth states from a second region of said storage device for a second of said butterfly operations;
    determining new path metrics for said third and fourth states based at least in part on said path metrics read from said storage device; and
    writing said new path metrics for said first butterfly operation to said second region.

2. The method of claim 1, further comprising:
    determining new path metrics for said first and second states based at least in part on said path metrics read from said storage device; and
    writing said new path metrics for said first and second states for said second butterfly operation to said first region of said storage device.

3. A method for determining a path metric associated with a butterfly operation of a digital processor, comprising:
    providing at least one existing path metric and at least one control word by retrieving said at least one path metric from a first location in XY memory;
    determining a first branch metric and a second branch metric based on said control word;
    if required, determining the negatives of at least one of said first and second branch metrics;

selecting one branch metric from the group comprising said first and second branch metrics and said at least one negative if determined;

determining at least one new path metric based at least in part on said selected branch metric and said at least one existing path metric; and storing said at least one new path metric at a second location within said XY memory, said second location being different from said first location.

4. The method of claim 3, wherein said digital processor comprises a user-extendable and configurable RISC processor.

5. A control data word for use in Viterbi decode operations of a digital processor, comprising:

at least first, second and third data fields, said first field contiguous within said word with said second field, said second field contiguous with said third field wherein said first, second, and third fields each comprising a plurality of data bits and relating to a first butterfly operation; and at least fourth, fifth and sixth data fields, said fourth field contiguous within said word with said fifth field, said fifth field contiguous with said sixth field wherein said fourth, fifth, and sixth fields each comprising a plurality of data bits and relating to a second butterfly operation;

said first and second butterfly operations each comprising two add-compare-select (ACS) operations;

said plurality of data bits for said first, second, fourth, and fifth fields comprising first and second data bits, said first and second bits being mapped to combinations of path and branch metrics, and said mapping of said first and second bits for said first and fourth fields comprises:
  (i) 00–path metric 0+branch metric 0
  (ii) 01–path metric 0+branch metric 1
  (iii) 10–path metric 0–branch metric 1
  (iv) 11–path metric 0–branch metric 0.

6. The data word of claim 5, wherein said mapping of said first and second bits for said second and fifth fields comprises:
  (i) 00–path metric 1+branch metric 0
  (ii) 01–path metric 1+branch metric 1
  (iii) 10–path metric 1–branch metric 1
  (iv) 11–path metric 1–branch metric 0.

7. The data word of claim 5, wherein said data bits of said third and sixth fields encode combinations of branch metrics disposed in first and second locations within at least one register.

8. A method of processing Viterbi state information within a processor having a memory, comprising:

providing a plurality of path metrics for each of a plurality of states;

concatenating at least two of said path metrics for adjacent states to produce a word; and storing said word at a location in memory, said path metrics comprising 16-bits in length, and said word comprising 32-bits.

9. The method of claim 8, wherein said act of storing comprises:

providing an addressing mode for storing data so that it can be read linearly during a subsequent decoding cycle; and storing said path metrics according to said addressing mode.

10. The method of claim 9, wherein said path metrics are stored according to said addressing mode in the order comprising $0, 2^{K-2}, 1, 2^{K-2}+1, 2, \ldots, 2^{K-2}-2, 2^{K-1}-2, 2^{K-2}-1, 2^{K-1}-1$.

11. A method of processing Viterbi state information within a processor having a memory, comprising:

providing a plurality of path metrics for each of a plurality of states;

concatenating at least two of said path metrics for adjacent states to produce a word; and storing said word at a location in memory, said storing comprising:

providing an addressing mode adapted to store data so that it can be read linearly during a subsequent decoding cycle; and storing said path metrics according to said addressing mode; and wherein said path metrics are stored according to said addressing mode in the order comprising $0, 2^{K-2}, 1, 2^{K-2}+1, 2, \ldots, 2^{K-2}-2, 2^{K-1}-2, 2^{K-2}-1, 2^{K-1}-1$.

12. A dual butterfly extension instruction, usable within the ISA of a user-configured digital processor, the extension instruction performing, when executed on said processor, at least two Viterbi butterfly decode operations, each of said decode operations comprising determining new path metrics using a plurality of add-compare-select (ACS) operations, obtaining existing path metrics from a first storage location associated with said processor, and storing said new path metrics at a second storage location different from the first.

13. The instruction of claim 12, wherein all of said decode operations are completed within one (1) machine cycle.

14. A digital processor having an instruction set with at least one Viterbi decode instruction, comprising:

a multistage pipeline;

a storage device configured to store a plurality of metric data; and add-compare-select (ACS) hardware operatively coupled to said pipeline and said storage device;

wherein said at least one instruction (i) performs multiple ACS operations associated with said Viterbi decode in a single instruction cycle using said ACS hardware; and (ii) stores metrics generated by said performance of said ACS operations within said storage device; and wherein said processor is user-configurable at design, said user-configurability including the ability to add at least one extension instruction to said instruction set, said at least one extension instruction comprising said at least one Viterbi decode instruction.

15. The processor of 14, wherein at least a portion of said ACS hardware is added to said design as part of adding said at least one Viterbi decode extension instruction to said instruction set.

16. The processor of claim 15, wherein said storage device comprises an XY memory, and said Viterbi decode extension instruction retrieves existing metrics from a first location within said XY memory, said act of storing metrics generated by performance of said ACS operations comprising storing at a second location different than the first.

17. The processor of claim 14, wherein said ACS operations utilize a control word having a plurality of fields for selecting a sum and difference metric, and branch metrics.

18. A digital processor having an instruction set with at least one Viterbi decode instruction, comprising:

a multistage pipeline;

a storage device configured to store a plurality of metric data; and add-compare-select (ACS) hardware operatively coupled to said pipeline and said storage device;

wherein said at least one instruction is adapted to (i) perform multiple ACS operations associated with said Viterbi decode in a single instruction cycle using said ACS hardware; and (ii) store metrics generated by said performance of said ACS operations within said storage device; and wherein said ACS operations utilize a control word having a plurality of fields for selecting a sum and difference metric, and branch metrics.

19. A method of providing an optimized communications operations processor, comprising;

providing a basecase processor core configuration having a base instructions set, said basecase core configuration being at least partly configurable by a user; and configuring said basecase core to form an extended core, said extended core comprising at least one communications operation extension instruction and associated hardware, and a storage device for storing data associated with said communications operations;

wherein said extended core runs a computer program including said at least one extension instruction, said extended core being optimized for performing said communications operations, and said communications operations comprise Viterbi butterfly operations, and said act of configuring comprises configuring said at least one extension instruction to perform a plurality of ACS operations associated with said Viterbi Butterfly operations in a single instruction cycle.

20. The method of claim 19, wherein said storage device comprises an XY memory, and said act of configuring further comprises configuring said extended core to retrieve path metrics from a first location of said XY memory using said at least one extension instruction, generate new path metrics using at least said retrieved path metrics and said ACS operations, and store said new path metrics in said XY memory at a second location different from said first location.

21. Apparatus for determining a path metric associated with a butterfly operation of a digital processor, comprising:

means for providing at least one existing path metric and at least one control word by retrieving said at least one path metric from a first location of a memory;

means for determining a first branch metric and a second branch metric based on said control word;

means for determining the negatives of at least one of said first and second branch metrics, if required;

means for selecting one branch metric from the group comprising said first and second branch metrics and said at least one negative if determined;

means for determining at least one new path metric based at least in part on said selected branch metric and said at least one existing path metric; and means for storing said at least one new path metric at a second location of said memory, said second location being different from said first location.

22. Apparatus for processing Viterbi state information within a processor having a memory, comprising:

means for providing a plurality of path metrics for each of a plurality of states;

means for concatenating at least two of said path metrics for adjacent states to produce a word; and means for storing said word at a location in memory, wherein said path metrics are 16-bits in length, and said word is 32-bits.

23. The apparatus of claim 22, wherein said storing comprises providing an addressing mode for storing data so that it can be read linearly during a subsequent decoding cycle.

24. A digital processor having an instruction set with at least one Viterbi decode instruction, comprising:

multistage pipeline means;

a storage device configured to store a plurality of metric data; and means for performing add-compare-select (ACS) operations operatively coupled to said pipeline and said storage device;

wherein said at least one instruction (i) performs multiple ACS operations associated with said Viterbi decode in a single instruction cycle using said means for performing; and (ii) stores metrics generated by said performance of said ACS operations within said storage device; and wherein said processor is user-configurable at design, said user-configurability including the ability to add at least one extension instruction to said instruction set, said at least one extension instruction comprising said at least one Viterbi decode instruction.

* * * * *